(12) United States Patent
Shirai (10) Patent No.: US 10,587,129 B2
(45) Date of Patent: Mar. 10, 2020

(54) ELECTRIC POWER SUPPLY SYSTEM

(71) Applicant: TOYOTA JIDOSHA KABUSHIKI KAISHA, Toyota-shi, Aichi-ken (JP)

(72) Inventor: Ken Shirai, Miyoshi (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 91 days.

(21) Appl. No.: 15/894,411

(22) Filed: Feb. 12, 2018

(65) Prior Publication Data

US 2018/0241225 A1    Aug. 23, 2018

(30) Foreign Application Priority Data

Feb. 21, 2017    (JP) .................................. 2017-030442

(51) Int. Cl.
| | | |
|---|---|---|
| H02J 7/00 | (2006.01) |
| H02J 7/14 | (2006.01) |
| B60L 58/20 | (2019.01) |
| G01R 31/3842 | (2019.01) |
| B60L 58/12 | (2019.01) |
| G01R 31/3828 | (2019.01) |

(52) U.S. Cl.
CPC ............ *H02J 7/0021* (2013.01); *B60L 58/12* (2019.02); *B60L 58/20* (2019.02); *G01R 31/3842* (2019.01); *H02J 7/1423* (2013.01); *B60L 2240/547* (2013.01); *G01R 31/3828* (2019.01); *H02J 2007/143* (2013.01); *Y02T 10/7011* (2013.01); *Y02T 10/7016* (2013.01); *Y02T 10/7044* (2013.01)

(58) Field of Classification Search
CPC .............................. H02J 7/1423; H02J 7/0021

USPC .......................................................... 320/126
See application file for complete search history.

(56) References Cited

U.S. PATENT DOCUMENTS

| | | | | |
|---|---|---|---|---|
| 2014/0091767 A1* | 4/2014 | Tamura | ................ | B60R 16/033 320/126 |
| 2015/0340884 A1* | 11/2015 | Suzuki | ...................... | B60L 7/12 320/107 |
| 2017/0005488 A1* | 1/2017 | Suzuki | .................. | H01M 10/48 |

FOREIGN PATENT DOCUMENTS

| | | |
|---|---|---|
| JP | 2013-214371 A | 10/2013 |
| JP | 2015-114105 A | 6/2015 |
| JP | 2015-137916 A | 7/2015 |
| WO | 2005/116675 A1 | 12/2005 |

* cited by examiner

*Primary Examiner* — Edward Tso
*Assistant Examiner* — Ahmed H Omar
(74) *Attorney, Agent, or Firm* — Oliff PLC (57) ABSTRACT

An electric power supply system includes a first battery provided in an electric power supply circuit; a second battery provided in the circuit and electrically connected in parallel to the first battery, the second battery being a lithium-ion battery; an electric load provided in the circuit and electrically connected in parallel to the first battery and the second battery; a switch provided in the circuit, and configured to electrically disconnect the second battery from the circuit when the switch is open; and a control device configured to open the switch when an ignition switch is on and an SOC of the first battery is equal to or higher than a prescribed SOC, and to execute an open-circuit voltage acquisition process that acquires an open-circuit voltage of the second battery after a lapse of a prescribed time from a time when the switch is opened.

6 Claims, 9 Drawing Sheets

ELECTRIC POWER SUPPLY SYSTEM

INCORPORATION BY REFERENCE

The disclosure of Japanese Patent Application No. 2017-030442 filed on Feb. 21, 2017 including the specification, drawings and abstract is incorporated herein by reference in its entirety.

BACKGROUND

1. Technical Field

The present disclosure relates to an electric power supply system.

2. Description of Related Art

There is known a technique of enhancing the accuracy in calculating a state of charge (an SOC) of a lithium-ion battery by electrically disconnecting the lithium-ion battery from an electric power supply circuit when an ignition switch is off, and acquiring an open-circuit voltage of the lithium-ion battery after the lapse of a given time (after the lithium-ion battery is depolarized) (e.g., see Japanese Patent Application Publication No. 2013-214371 (JP 2013-214371 A)).

SUMMARY

However, after the time lapse from the time when the ignition switch is turned on, it is difficult to acquire the open-circuit voltage of the lithium-ion battery, and thus, it is difficult to correct the SOC of the lithium-ion battery. As soon as the ignition switch is turned on, the SOC of the lithium-ion battery can be updated based on an integrated current value as an integrated value of a charge current of the lithium-ion battery and a discharge current of the lithium-ion battery from the timing when the ignition switch is turned on. However, there is an apprehension that the error in the SOC may increase as the integrated current value increases.

Thus, an aspect of the disclosure makes it possible to acquire an open-circuit voltage of a lithium-ion battery after a time lapse from a time when the ignition switch is turned on.

An electric power supply system according to an aspect of the disclosure includes a first battery provided in an electric power supply circuit; a second battery provided in the electric power supply circuit and electrically connected in parallel to the first battery, the second battery being a lithium-ion battery; an electric load provided in the electric power supply circuit and electrically connected in parallel to the first battery and the second battery; a switch provided in the electric power supply circuit and configured to electrically disconnect the second battery from the electric power supply circuit when the switch is open; and a control device configured to open the switch when an ignition switch is on and a state of charge of the first battery is equal to or higher than a prescribed state of charge, and to execute an open-circuit voltage acquisition process that acquires an open-circuit voltage of the second battery after a lapse of a prescribed time from a time when the switch is opened.

According to the above-described aspect of the disclosure, the open-circuit voltage of the lithium-ion battery can be acquired when the ignition switch is on (after a time lapse from the time when the ignition switch is turned on). When the state of charge (SOC) of the first battery is equal to or higher than the prescribed state of charge, the switch is opened. Therefore, it is possible to reduce the possibility of occurrence of an inconvenience resulting from the opening of the switch, namely, the possibility that the SOC of the first battery relatively rapidly decreases and falls below a lower limit due to electric disconnection of the lithium-ion battery from the electric power supply circuit.

In the above-described aspect of the disclosure, the control device may be configured to further execute a state-of-charge calculation process that calculates a state of charge of the second battery, based on the open-circuit voltage acquired through the open-circuit voltage acquisition process. With this configuration, when the ignition switch is on, it is possible to obtain the SOC of the second battery with high accuracy based on the open-circuit voltage acquired through the open-circuit voltage acquisition process.

In the above-described aspect of the disclosure, the control device may be configured to execute the open-circuit voltage acquisition process and the state-of-charge calculation process, when an integrated current value becomes equal to or larger than a prescribed value, the integrated current value being an integrated value of a charge current of the second battery and a discharge current of the second battery. With this configuration, it is possible to obtain the SOC of the second battery with high accuracy, at timing when the accuracy in calculating the SOC of the second battery is highly likely to have deteriorated.

In the above-described aspect of the disclosure, the control device may be configured to further execute a charge process that charges the first battery such that the state of charge of the first battery becomes equal to or higher than the prescribed state of charge, in a case where the state of charge of the first battery is not equal to or higher than the prescribed state of charge when the integrated current value becomes equal to or larger than the prescribed value. With this configuration, even in the case where the SOC of the first battery is not equal to or higher than the prescribed SOC at the timing when the accuracy in calculating the SOC of the second battery is highly likely to have deteriorated, the open-circuit voltage acquisition process and the SOC calculation process can be started after the SOC of the first battery is increased.

The electric power supply system according to the above-described aspect of the disclosure may further include an alternator provided in the electric power supply circuit, the alternator being electrically connected in parallel to the first battery, the second battery, and the electric load. The charge process may include charging the first battery through use of the second battery and the alternator. With this configuration, the first battery can be quickly charged through the use of the second battery and the alternator.

According to the above-described aspect of the disclosure, the open-circuit voltage of the lithium-ion battery can be acquired after a time lapse from the time when the ignition switch is turned on.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

An embodiment of the disclosure will be described hereinafter in detail with reference to the accompanying drawings.

Figure 1:
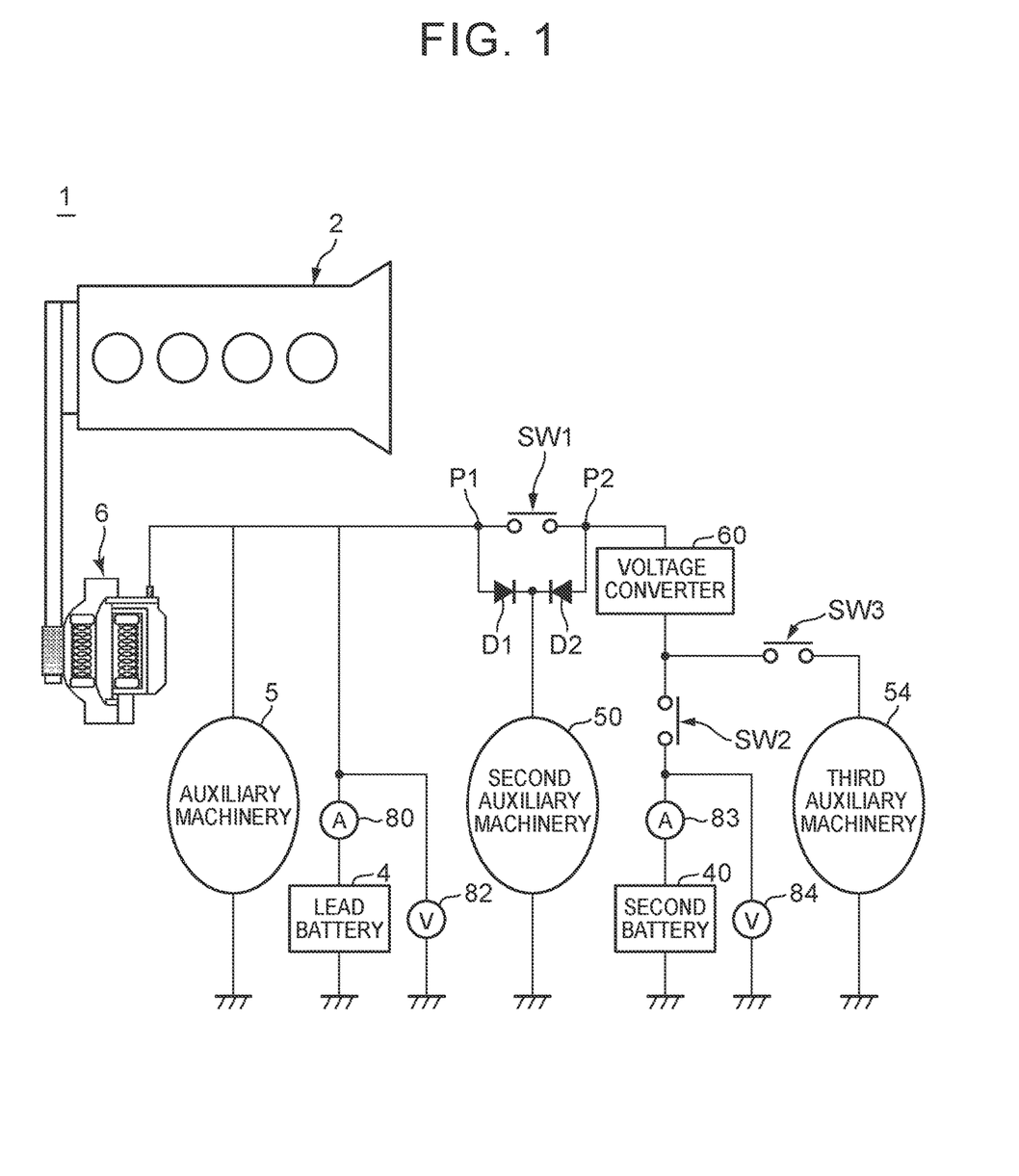
FIG. 1 is a schematic view showing an electric system of a dual electric power supply system according an embodiment of the disclosure.

FIG. 1 is a schematic view showing an electric system of a dual electric power supply system 1 according to the embodiment of the disclosure.

As shown in FIG. 1, the dual electric power supply system 1 includes, in an electric power supply circuit, a lead battery 4, auxiliary machinery 5 (an example of an electric load), an alternator 6, a lithium-ion battery (second battery) 40, second auxiliary machinery 50 (an example of an electric load), third auxiliary machinery 54 (an example of an electric loads), and a voltage converter 60.

The lead battery 4 has a rated voltage of, for example, 12 V. A current sensor 80 and a voltage sensor 82 are provided for the lead battery 4. The current sensor 80 detects a current flowing to the lead battery 4 or a current flowing from the lead battery 4. The voltage sensor 82 detects a voltage of the lead battery 4.

The auxiliary machinery 5 includes at least one electric load that is supplied with electric power from the lead battery 4. The auxiliary machinery 5 includes, for example, a starter, seat heaters, lamps, a blower, wipers, and an electric fan.

The alternator 6 is mechanically connected to the engine 2. The alternator 6 is a generator that generates electric power through the use of the power of the engine 2. The electric power generated by the alternator 6 is utilized, for example, to charge the lead battery 4, and to operate the auxiliary machinery 5.

The lithium-ion battery 40 has a rated voltage that is higher than the rated voltage of the lead battery 4 and that is equal to, for example, 24 V or 48 V. The lithium-ion battery 40 is electrically connected in parallel to the lead battery 4, the auxiliary machinery 5, the alternator 6, and the like. A current sensor 83 and a voltage sensor 84 are provided for the lithium-ion battery 40. The current sensor 83 detects a current flowing to the lithium-ion battery 40 or a current flowing from the lithium-ion battery 40. The voltage sensor 84 detects a voltage of the lithium-ion battery 40.

The second auxiliary machinery 50 includes at least one electric load that is supplied with electric power from the lithium-ion battery 40. The second auxiliary machinery 50 is different from the auxiliary machinery 5. The second auxiliary machinery 50 may be auxiliary machinery that is required to be highly reliable. The second auxiliary machinery 50 may include, for example, a shift-by-wire device (an actuator of a transmission), an electric parking brake (an EPB), or an assist motor of a power steering system.

The second auxiliary machinery 50 is electrically connected to the lead battery 4 and the alternator 6 via a first diode D1 that is disposed in such a direction as to allow a current to flow toward the second auxiliary machinery 50. The second auxiliary machinery 50 is electrically connected to the lithium-ion battery 40 via a second diode D2 that is disposed in such a direction as to allow a current to flow toward the second auxiliary machinery 50.

The third auxiliary machinery 54 is electrically connected between the lithium-ion battery 40 and the voltage converter 60 via a switch SW3. The third auxiliary machinery 54 is a high-voltage load that operates at an output voltage (an output voltage during step-up operation (voltage boosting operation)) of the lithium-ion battery 40 or the voltage converter 60.

The voltage converter 60 is a voltage converter that operates at a direct-current (DC) voltage, and is referred to also as a DC-DC converter. During the step-up operation, the voltage converter 60 steps up a voltage on the lead battery 4-side and the alternator 6-side, and applies this voltage to the lithium-ion battery 40 and the third auxiliary machinery 54. Accordingly, when the voltage converter 60 performs step-up operation, the lithium-ion battery 40 is charged. During step-down operation, the voltage converter 60 steps down a voltage on the lithium-ion battery 40-side, and applies this voltage to the lead battery 4, the auxiliary machinery 5, the second auxiliary machinery 50, and the like. Accordingly, when the voltage converter 60 performs step-down operation, the lead battery 4 can be charged with the current from the lithium-ion battery 40.

The switch SW1 is provided at such a position that the second auxiliary machinery 50 and the lithium-ion battery 40 can be electrically disconnected from the lead battery 4, the alternator 6, and the auxiliary machinery 5 when the switch SW1 is off (when the switch SW1 is open). The switch SW1 is provided between an anode-side point P1 of the first diode D1 and an anode-side point P2 of the second diode D2. The switch SW1 is formed by, for example, a relay.

The switch SW2 is provided at such a position that the lithium-ion battery 40 can be electrically disconnected from the lead battery 4, the alternator 6, the auxiliary machinery 5, the second auxiliary machinery 50, and the third auxiliary machinery 54 when the switch SW2 is off (when the switch SW2 is open). The switch SW2 is formed by, for example, a relay. The switch SW2 is basically on. As will be described below, the switch SW2 is turned off when an open-circuit voltage acquisition process that will be described later, or the like is executed.

The switch SW3 is provided at such a position that the third auxiliary machinery 54 can be electrically disconnected from the lithium-ion battery 40 and the voltage converter 60 when the switch SW3 is off (when the switch SW3 is open). The switch SW3 is formed by, for example, a relay. The switch SW3 is basically on. The following description will be provided on the assumption that the switch SW1 and the switch SW3 are on when an ignition switch is on.

Figure 2:
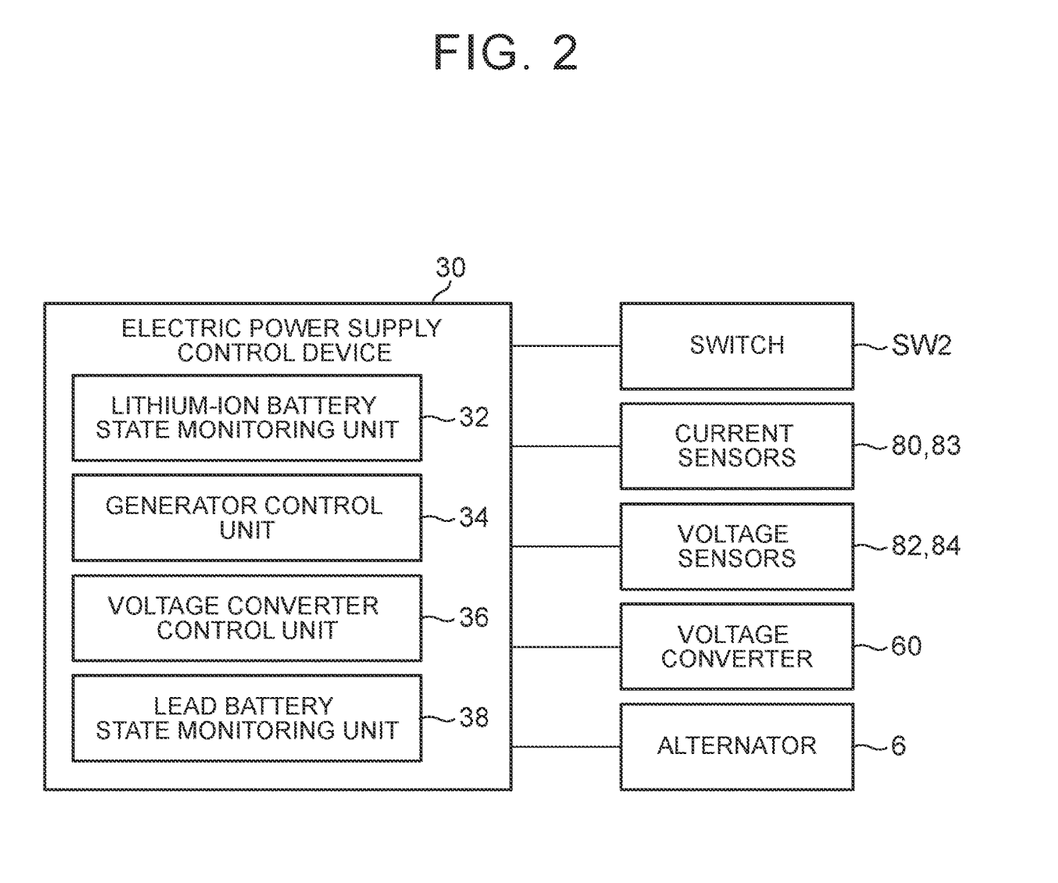
FIG. 2 is a schematic configuration diagram of an example of a control system of the dual electric power supply system 1.

FIG. 2 is a schematic configuration diagram of an example of a control system of the dual electric power supply system 1.

The dual electric power supply system 1 includes an electric power supply control device 30. The electric power supply control device 30 is formed by a computer, and is realized by, for example, an electronic control unit (an ECU). Although not shown in the drawing, the electric power supply control device 30 includes memories such as a random access memory (a RAM), a read only memory (a ROM) and an auxiliary storage device, a communication interface, and the like as well as a central processing unit (a CPU), as a hardware configuration. The alternator 6, the voltage converter 60, the current sensors 80 and 83, the voltage sensors 82 and 84, and the switch SW2 are connected to the electric power supply control device 30.

The electric power supply control device 30 includes a lithium-ion battery state monitoring unit 32, a generator control unit 34, a voltage converter control unit 36, and a lead battery state monitoring unit 38. The lithium-ion battery state monitoring unit 32, the generator control unit 34, the voltage converter control unit 36, and the lead battery state monitoring unit 38 can be realized through the execution of programs in the memories by the CPU of the electric power supply control device 30.

The lithium-ion battery state monitoring unit 32 calculates a state of charge (SOC) of the lithium-ion battery 40 in each prescribed cycle, based on information from the current sensor 83 and the voltage sensor 84. The SOC of the lithium-ion battery 40 can be calculated based on, for example, the SOC of the lithium-ion battery 40 at the time when the ignition switch is turned on and a charge/discharge amount integrated value of the lithium-ion battery 40 from the time when the ignition switch is turned on. The SOC of the lithium-ion battery 40 at the time when the ignition switch is turned on is derived based on an open-circuit voltage as a voltage value detected by the voltage sensor 84 in a state where the switch SW2 is off. As is generally known, the SOC of the lithium-ion battery and the open-circuit voltage of the depolarized lithium-ion battery are closely correlated with each other. When the ignition switch is off, the lithium-ion battery 40 is substantially not charged or discharged, and thus, the lithium-ion battery 40 is highly likely to have been depolarized. Accordingly, by using the open-circuit voltage at the time when the ignition switch is turned on, it is possible to accurately calculate the SOC of the lithium-ion battery 40.

The lithium-ion battery state monitoring unit 32 executes the open-circuit voltage acquisition process. The open-circuit voltage acquisition process includes turning off the switch SW2 when the ignition switch is on and the SOC of the lead battery 4 is equal to or higher than a prescribed SOC (hereinafter referred to as "a depolarization enabling SOC (an SOC that enables depolarization of the lithium-ion battery 40)"), and acquiring the open-circuit voltage of the lithium-ion battery 40 after the lapse of a prescribed time (hereinafter referred to as "a depolarization discharge time Ta") from the time when the switch SW2 is turned off. Due to the open-circuit voltage acquisition process, the open-circuit voltage of the lithium-ion battery 40 can be acquired after a time lapse from the time when the ignition switch is turned on.

The depolarization enabling SOC is a value obtained by adding a prescribed margin value to a prescribed regular lower-limit SOC of the lead battery 4. The prescribed margin value corresponds to an upper limit of a decrease amount by which the SOC of the lead battery 4 may decrease when the lithium-ion battery 40 remains electrically disconnected for the depolarization discharge time Ta. The prescribed margin value is determined through a test or the like.

The depolarization discharge time Ta corresponds to a time that is required from the turning off of the switch SW2 after the lithium-ion battery 40 is polarized, to depolarization. The depolarization discharge time Ta is determined through a test or the like. When the lithium-ion battery 40 is depolarized, it is possible to obtain the open-circuit voltage that allows the SOC to be calculated with high accuracy.

The lithium-ion battery state monitoring unit 32 further executes an SOC calculation process for calculating the SOC of the lithium-ion battery 40, based on the acquired open-circuit voltage, after the open-circuit voltage acquisition process. Due to the SOC calculation process, it is possible to obtain the SOC of the lithium-ion battery 40 with high accuracy, after a time lapse from the time when the ignition switch is turned on. The operation of the lithium-ion battery state monitoring unit 32 will be described in more detail later.

The generator control unit 34 performs the control of controlling the electric power generation voltage of the alternator 6 (charge control). An example of operation of the generator control unit 34 will be described later.

The voltage converter control unit 36 controls the operation (the step-up or step-down operation) of the voltage converter 60 and the output voltage thereof. An example of operation of the voltage converter control unit 36 will be described later.

The lead battery state monitoring unit 38 calculates an SOC of the lead battery 4 in each prescribed cycle, based on information from the current sensor 80 and the voltage sensor 82. The SOC of the lead battery 4 can be calculated based on, for example, the SOC of the lead battery 4 at the time when the ignition switch is turned on and the charge/discharge amount integrated value of the lead battery 4 from the time when the ignition switch is turned on. An example of operation of the lead battery state monitoring unit 38 will be described later.

Next, an example of operation of the dual electric power supply system 1 will be described in more detail with reference to FIGS. 3 to 9.

Figure 3:
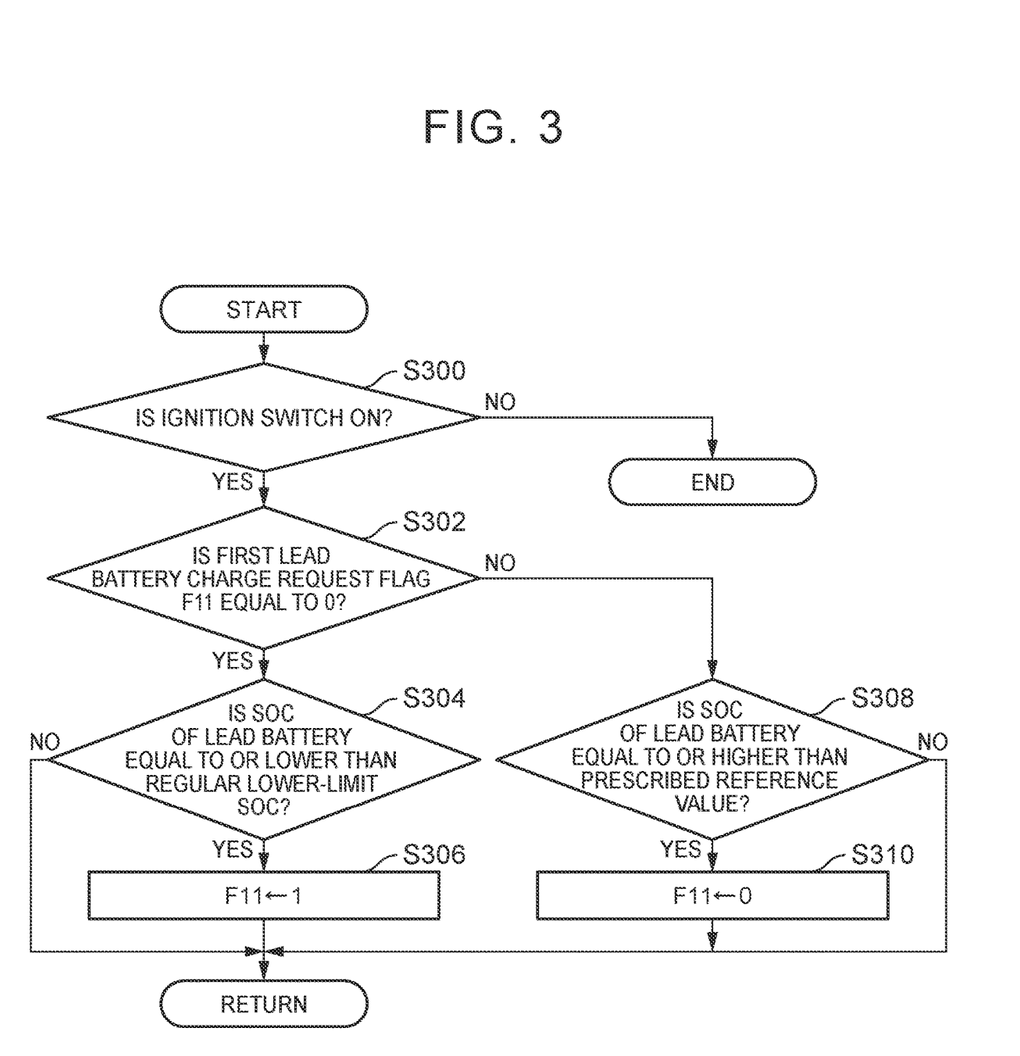
FIG. 3 is a schematic flowchart showing an example of a process that is executed by a lead battery state monitoring unit.

FIG. 3 is a schematic flowchart showing an example of a process that is executed by the lead battery state monitoring unit 38. The process shown in FIG. 3 is executed, for example, in each prescribed cycle.

In step S300, the lead battery state monitoring unit 38 determines whether the ignition switch is on (hereinafter referred to also as "an IG-on state"). If the result of the determination is "YES", the lead battery state monitoring unit 38 proceeds to step S302. Otherwise (if the ignition switch is off), the lead battery state monitoring unit 38 ends the present routine.

In step S302, the lead battery state monitoring unit 38 determines whether a first lead battery charge request flag F11 is equal to "0". The state where the first lead battery charge request flag F11 is equal to "0" indicates that the lead battery state monitoring unit 38 does not request lead battery SOC increasing control that will be described later. The initial value of the first lead battery charge request flag F11 (the value at the time when the ignition switch is turned on) is equal to "0". If the result of the determination is "YES", the lead battery state monitoring unit 38 proceeds to step S304. Otherwise, the lead battery state monitoring unit 38 proceeds to step S308.

In step S304, the lead battery state monitoring unit 38 determines whether the SOC of the lead battery 4 is equal to or lower than the prescribed regular lower-limit SOC. The prescribed regular lower-limit SOC is, for example, a value that is higher than an unavailable lower-limit region of the SOC by a prescribed margin. If the result of the determination is "YES", the lead battery state monitoring unit 38 proceeds to step S306. Otherwise, the lead battery state monitoring unit 38 ends the process in the present cycle.

In step S306, the lead battery state monitoring unit 38 sets the first lead battery charge request flag F11 to "1". When the first lead battery charge request flag F11 is set to "1", the SOC of the lead battery 4 is increased by the generator control unit 34 and the voltage converter control unit 36 (see step S404 of FIG. 4A and step S414 of FIG. 4B as will be described later).

In step S308, the lead battery state monitoring unit 38 determines whether the SOC of the lead battery 4 is equal to or higher than a prescribed reference value. The prescribed reference value is a value that is significantly higher than the prescribed regular lower-limit SOC. In the present embodiment of the disclosure, for example, the prescribed reference value is equal to the above-described depolarization enabling SOC. If the result of the determination is "YES", the lead battery state monitoring unit 38 proceeds to step S310. Otherwise, the lead battery state monitoring unit 38 ends the process in the present cycle.

In step S310, the lead battery state monitoring unit 38 resets the first lead battery charge request flag F11 to "0".

According to the process shown in FIG. 3, when the SOC of the lead battery 4 becomes equal to or lower than the prescribed regular lower-limit SOC, the first lead battery charge request flag F11 can be set to "1". Thus, the SOC of the lead battery 4 can be prevented from becoming significantly lower than the prescribed regular lower-limit SOC.

Figure 4A:
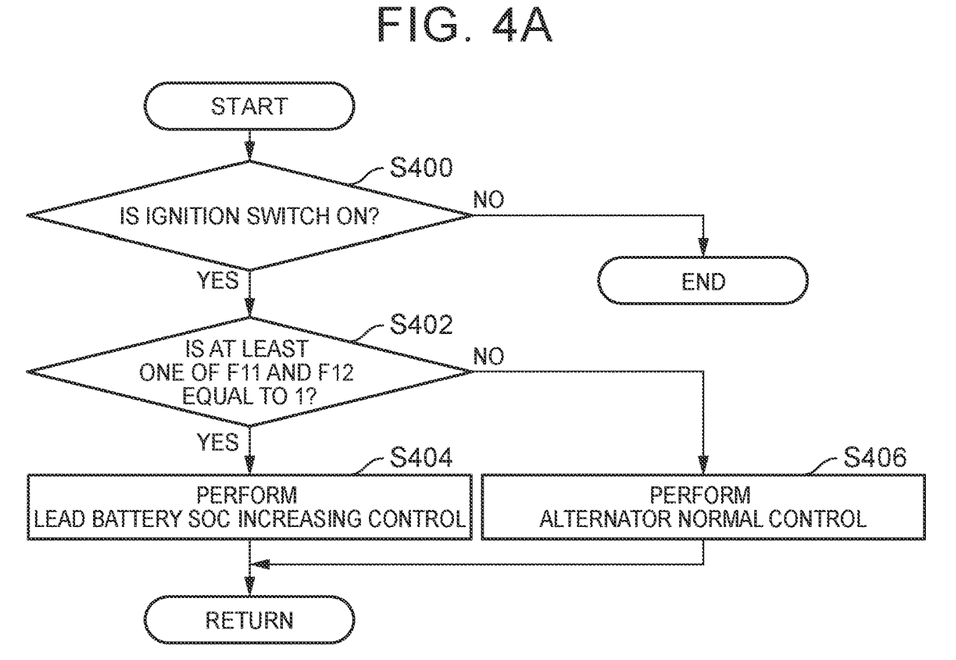
FIG. 4A is a schematic flowchart showing an example of a process that is executed by a generator control unit.

FIG. 4A is a schematic flowchart showing an example of a process that is executed by the generator control unit 34. The process shown in FIG. 4A is executed, for example, in each prescribed cycle.

In step S400, the generator control unit 34 determines whether the IG-on state is established (i.e., whether the ignition switch is on). If the result of the determination is "YES", the generator control unit 34 proceeds to step S402. Otherwise (if the ignition switch is off), the generator control unit 34 ends the present routine.

In step S402, the generator control unit 34 determines whether at least one of the first lead battery charge request flag F11 and a second lead battery charge request flag F12 that will be described later is equal to "1". If the result of the determination is "YES", the generator control unit 34 proceeds to step S404. Otherwise (if both the first lead battery charge request flag F11 and the second lead battery charge request flag F12 are equal to "0"), the generator control unit 34 proceeds to step S406.

In step S404, the generator control unit 34 performs the control of increasing the SOC of the lead battery 4 (hereinafter referred to as "lead battery SOC increasing control"). The lead battery SOC increasing control is realized by, for example, setting the electric power generation voltage of the alternator 6 to an upper limit (or a value that is significantly higher than a voltage value of the lead battery 4 based on the voltage sensor 82). For example, when the electric power generation voltage of the alternator 6 is controlled to an electric power generation command voltage within a range of 12.5 V to 13.8 V in a state where the vehicle is traveling at a steady vehicle speed, the upper limit is 13.8 V.

In step S406, the generator control unit 34 performs electric power generation control (normal control) in accordance with the traveling state of the vehicle. For example, the generator control unit 34 determines the electric power generation voltage of the alternator 6 (the electric power generation command voltage) based on the traveling state of the vehicle and the SOC of the lead battery 4, and provides a control signal corresponding to the electric power generation command voltage to the alternator 6. The traveling state of the vehicle is, for example, a stopped state, an accelerated state, a steady vehicle speed state, a decelerated state, or the like. The electric power generation voltage of the alternator 6 corresponding to the traveling state of the vehicle is determined according to a given method. In the present embodiment of the disclosure, for example, when the traveling state of the vehicle is the steady vehicle speed state (a state where the vehicle speed is substantially constant), the generator control unit 34 provides the control signal for the electric power generation voltage of the alternator 6 such that the SOC of the lead battery 4 becomes equal to a constant value α (<100%) (e.g., the electric power generation command voltage=12.5 V to 13.8 V). When the traveling state of the vehicle is the accelerated state, the generator control unit 34 substantially stops the electric power generation of the alternator 6 to enhance acceleration performance. When the traveling state of the vehicle is the decelerated state, the generator control unit 34 carries out regenerative electric power generation of the alternator 6 (the electric power generation command voltage=14.8 V in the present example).

Figure 4B:
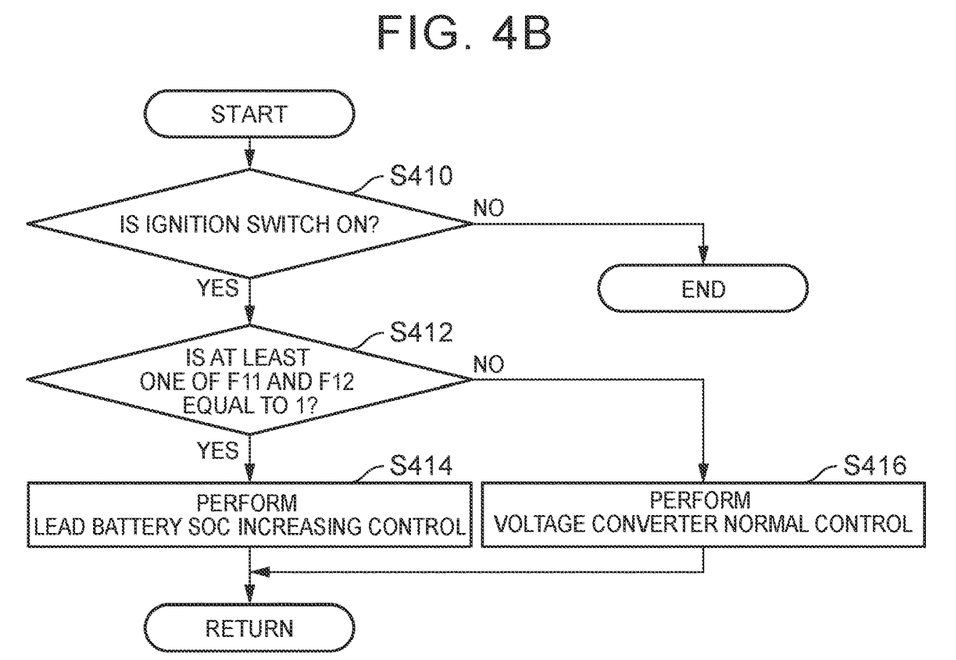
FIG. 4B is a schematic flowchart showing an example of a process that is executed by a voltage converter control unit.

FIG. 4B is a schematic flowchart showing an example of a process that is executed by the voltage converter control unit 36. The process shown in FIG. 4B is executed, for example, in each prescribed cycle.

In step S410, the voltage converter control unit 36 determines whether the IG-on state is established (i.e., whether the ignition switch is on). If the result of the determination is "YES", the voltage converter control unit 36 proceeds to step S412. Otherwise (if the ignition switch is off), the voltage converter control unit 36 ends the present routine.

In step S412, the voltage converter control unit 36 determines whether at least one of the first lead battery charge request flag F11 and the second lead battery charge request flag F12 that will be described later is equal to "1". If the result of the determination is "YES", the voltage converter control unit 36 proceeds to step S414. Otherwise (if both the first lead battery charge request flag F11 and the second lead battery charge request flag F12 that will be described later are equal to "0"), the voltage converter control unit 36 proceeds to step S416.

In step S414, the voltage converter control unit 36 performs the control of increasing the SOC of the lead battery 4 (lead battery SOC increasing control). The lead battery SOC increasing control is realized by, for example, causing the voltage converter 60 to perform the step-up operation and setting the output voltage of the voltage converter 60 to an upper limit (or a value that is significantly higher than a voltage value of the lead battery 4 based on the voltage sensor 82).

In step S416, the voltage converter control unit 36 performs normal control for the voltage converter 60. For example, the voltage converter control unit 36 determines the operation (the step-up operation or the step-down operation) of the voltage converter 60, and sets a target value of the output voltage, based on the SOC of the lithium-ion battery 40 and the like. For example, the voltage converter control unit 36 determines the operation of the voltage converter 60 and sets the target value of the output voltage such that the SOC of the lithium-ion battery 40 is held between a prescribed usable upper-limit SOC and a prescribed usable lower-limit SOC (see FIG. 9).

Figure 5:
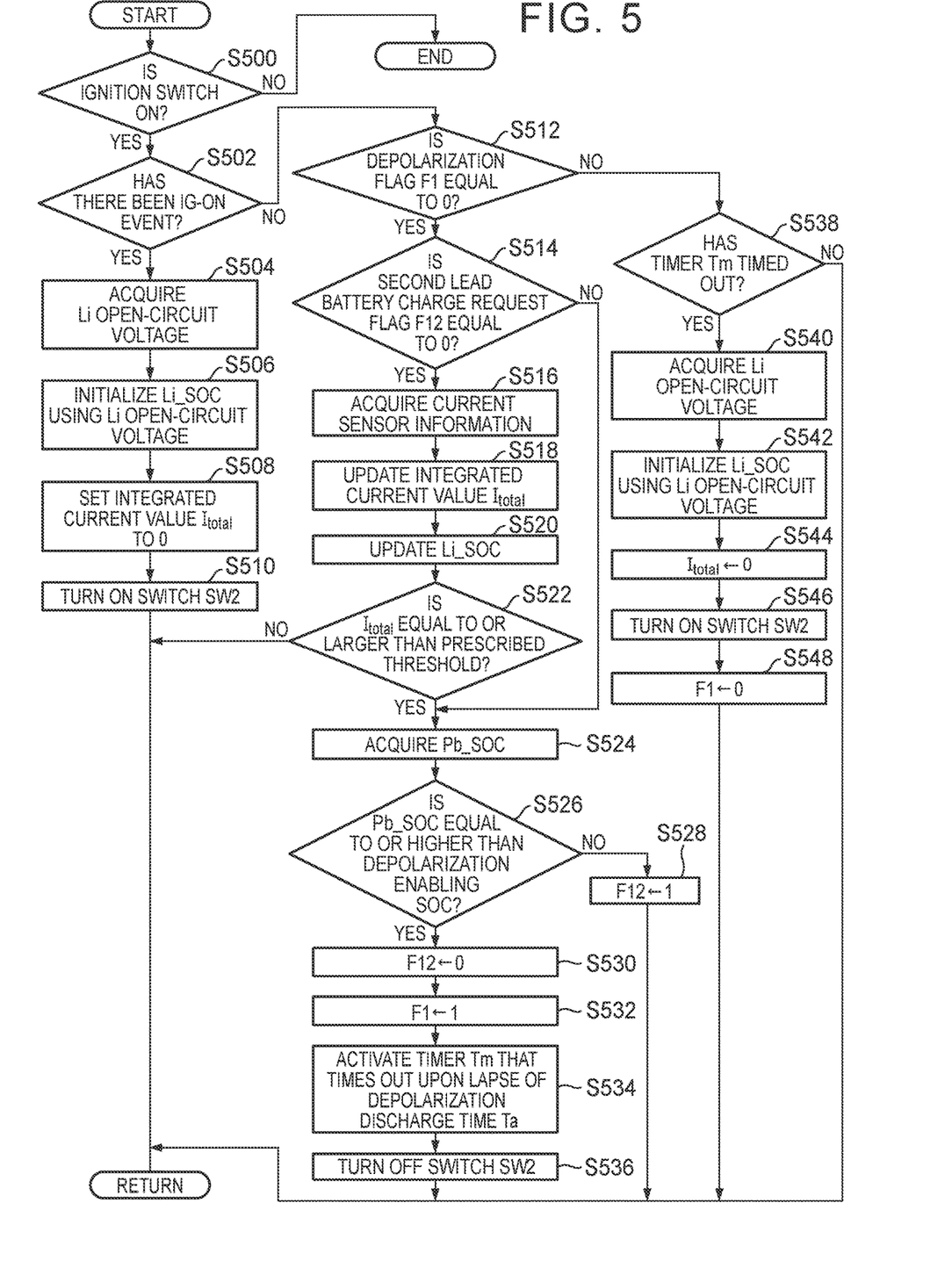
FIG. 5 is a schematic flowchart showing an example of a process that is executed by a lithium-ion battery state monitoring unit.
Figure 6:
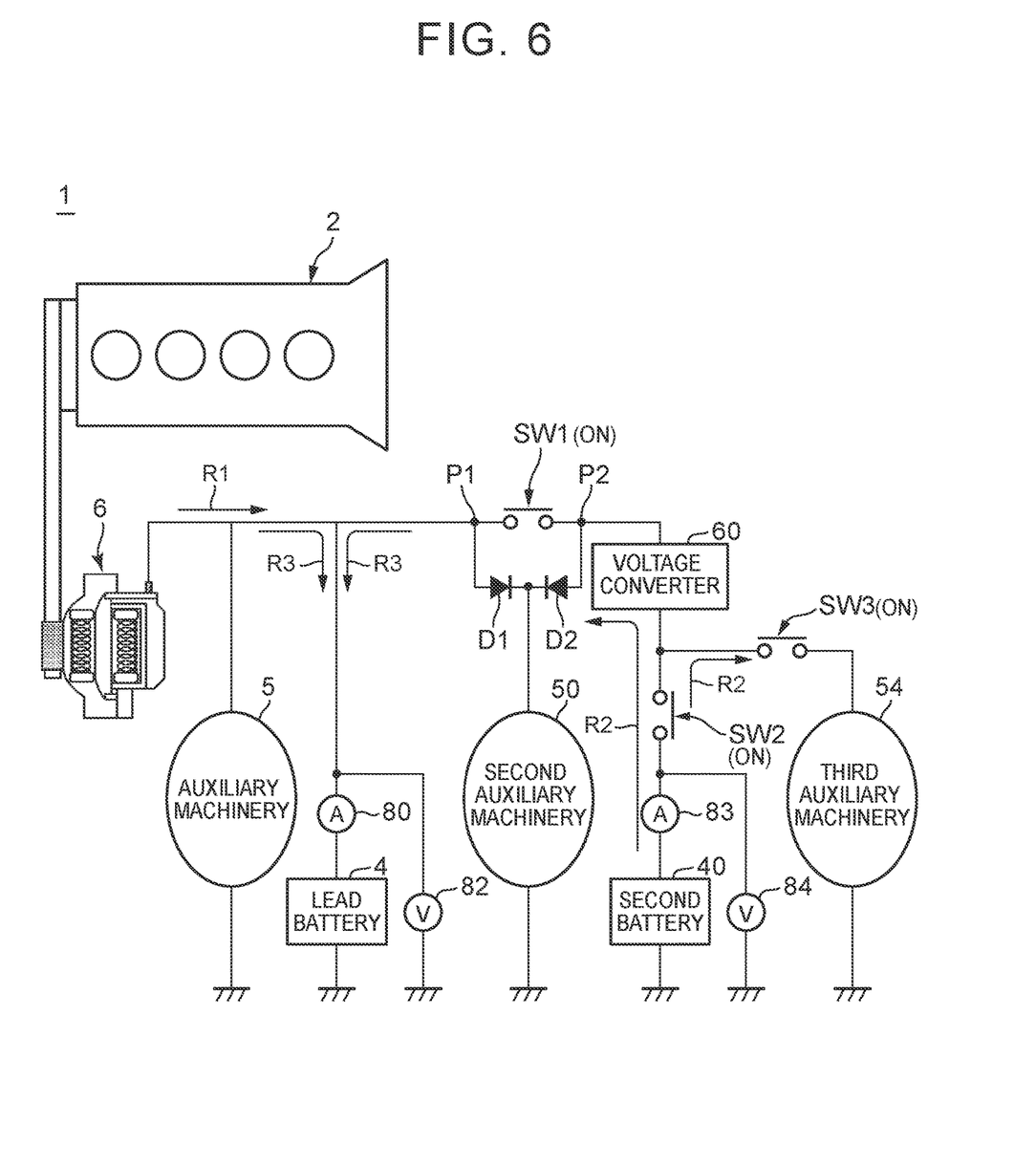
FIG. 6 is a view illustrating the flow of a current during lead battery SOC increasing control.
Figure 7:
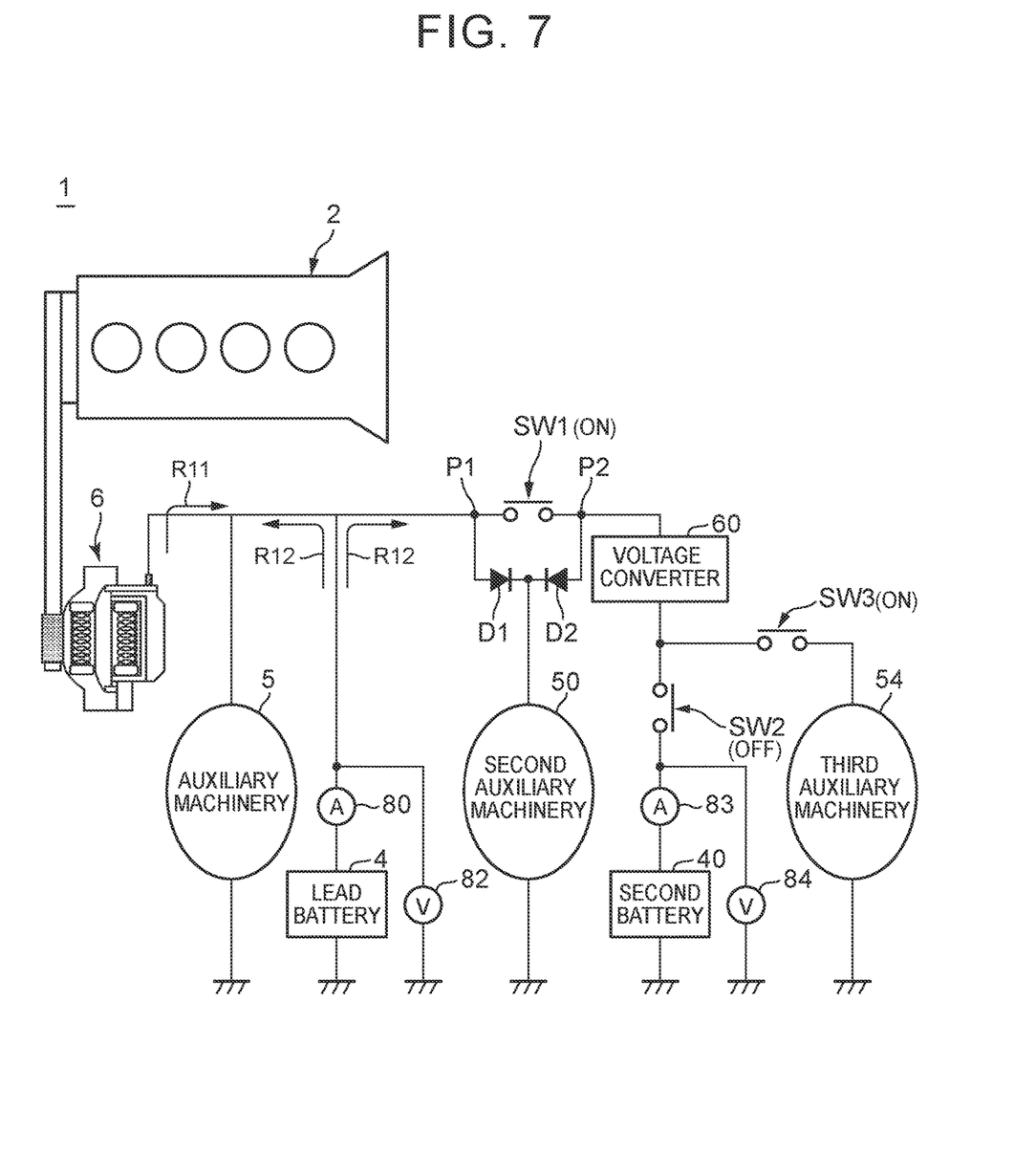
FIG. 7 is a view illustrating the flow of a current in a state where a switch is open.

FIG. 5 is a schematic flowchart showing an example of a process that is executed by the lithium-ion battery state monitoring unit 32. Each of FIGS. 6 and 7 is a view illustrating the flow of a current in the electric system of the dual electric power supply system 1 shown in FIG. 1. The process shown in FIG. 5 is executed, for example, in each prescribed cycle.

In step S500, the lithium-ion battery state monitoring unit 32 determines whether the IG-on state is established (i.e., whether the ignition switch is on). If the result of the determination is "YES", the lithium-ion battery state monitoring unit 32 proceeds to step S502. Otherwise (if the ignition switch is off), the lithium-ion battery state monitoring unit 32 ends the present routine.

In step S502, the lithium-ion battery state monitoring unit 32 determines whether there has been an on-event of the ignition switch (in other words, an IG-ON event, that is, an event in which the ignition switch is turned on) in the present processing cycle. If the result of the determination is "YES", the lithium-ion battery state monitoring unit 32 proceeds to step S504. Otherwise (in other words, if the IG-on state has already been established in the present processing cycle, i.e., if the ignition switch has been already in the "on" state in the present processing cycle), the lithium-ion battery state monitoring unit 32 proceeds to step S512.

In step S504, the lithium-ion battery state monitoring unit 32 acquires an open-circuit voltage of the lithium-ion battery 40 (described as "Li open-circuit voltage" in FIG. 5), based on the output value of the voltage sensor 84.

In step S506, the lithium-ion battery state monitoring unit 32 initializes the SOC of the lithium-ion battery 40 (described as "Li_SOC" in FIG. 5) by calculating the SOC of the lithium-ion battery 40 based on the open-circuit voltage acquired in step S504. For example, the SOC of the lithium-ion battery 40 can be calculated from the open-circuit voltage, through the use of a characteristic map or relational expression representing a relationship between the open-circuit voltage and the SOC.

In step S508, the lithium-ion battery state monitoring unit 32 initializes an integrated current value $I_{total}$ of the lithium-ion battery 40 to "0". The integrated current value $I_{total}$ is the sum of the absolute value of the integrated value of the current value of the discharge current (the integrated value along a time axis, the same will hold true hereinafter) and the absolute value of the integrated value of the current value of the charge current.

In step S510, the lithium-ion battery state monitoring unit 32 turns on the switch SW2. When the ignition switch is turned on, the other switches SW1 and SW3 are also turned on.

In step S512, the lithium-ion battery state monitoring unit 32 determines whether a depolarization flag F1 is equal to "0". The state where the depolarization flag F1 is equal to "0" indicates that a depolarization process that will be described later is not being executed. The initial value of the depolarization flag F1 (a value at the time when the ignition switch is turned on) is equal to "0". If the result of the determination is "YES", the lithium-ion battery state monitoring unit 32 proceeds to step S514. Otherwise, the lithium-ion battery state monitoring unit 32 proceeds to step S538.

In step S514, the lithium-ion battery state monitoring unit 32 determines whether the second lead battery charge request flag F12 is equal to "0". The state where the second lead battery charge request flag F12 is equal to "0" indicates that the lithium-ion battery state monitoring unit 32 does not request the above-described lead battery SOC increasing control. The initial value of the second lead battery charge request flag F12 (a value at the time when the ignition switch is turned on) is equal to "0".

In step S516, the lithium-ion battery state monitoring unit 32 acquires information from the current sensor 83.

In step S518, the lithium-ion battery state monitoring unit 32 updates the integrated current value $I_{total}$, based on the information from the current sensor 83 obtained in step S516 (the current value of the discharge current or the charge current). For example, in a case where the prescribed cycle in FIG. 5 is denoted by $\Delta T$ and the magnitude of the current value of the discharge current or the charge current is denoted by $|I|$, the integrated current value $I_{total}$ may be updated according to the following expression.

(the present value of $I_{total}$)=(the last value of $I_{total}$)+ $\Delta T \times |I|$.

In step S520, the lithium-ion battery state monitoring unit 32 updates the SOC of the lithium-ion battery 40, based on the information from the current sensor 83 obtained in step S516 (the current value of the discharge current or the charge current). For example, the lithium-ion battery state monitoring unit 32 updates an integrated value $I_{total\ discharge}$ of the current value of the discharge current and an integrated value $I_{total\ charge}$ of the current value of the charge current, and updates the SOC of the lithium-ion battery 40 based on a difference between the integrated value $I_{total\ discharge}$ and the integrated value $I_{total\ charge}$.

In step S522, the lithium-ion battery state monitoring unit 32 determines whether the integrated current value $I_{total}$ obtained in step S518 is equal to or larger than a prescribed threshold. The prescribed threshold is a threshold for detecting deterioration in the accuracy of the SOC of the lithium-ion battery 40 obtained in step S520. The prescribed threshold is determined through a test or the like in accordance with the required accuracy or the like. In general, as the integrated current value $I_{total}$ increases, the accuracy in calculating the SOC based on the integrated value (the integrated value $I_{total\ discharge}$ or the integrated value $I_{total\ charge}$) deteriorates due to the influence of integration. Accordingly, the prescribed threshold decreases as the required accuracy increases. If the result of the determination is "YES", the lithium-ion battery state monitoring unit 32 proceeds to step S524. Otherwise, the lithium-ion battery state monitoring unit 32 ends the process in the present cycle.

In step S524, the lithium-ion battery state monitoring unit 32 acquires the SOC of the lead battery 4 (described as "Pb_SOC" in FIG. 5).

In step S526, the lithium-ion battery state monitoring unit 32 determines whether the SOC of the lead battery 4 obtained in step S524 is equal to or higher than the depolarization enabling SOC. If the result of the determination is "YES", the lithium-ion battery state monitoring unit 32 proceeds to step S530. Otherwise, the lithium-ion battery state monitoring unit 32 proceeds to step S528.

In step S528, the lithium-ion battery state monitoring unit 32 sets the second lead battery charge request flag F12 to "1" or maintains the second lead battery charge request flag F12 at "1". When the second lead battery charge request flag F12 is set to "1", the lead battery SOC increasing control is performed by the generator control unit 34 and the voltage converter control unit 36 (see step S404 of FIG. 4A and step S414 of FIG. 4B as described above). When the lead battery SOC increasing control is performed, electric power is supplied to the auxiliary machinery 5, the second auxiliary machinery 50, and the third auxiliary machinery 54 by the alternator 6 and the lithium-ion battery 40, as shown by arrows R1 and R2 schematically indicating the flow of current in FIG. 6. The charging of the lead battery 4 with the current from the alternator 6 and the lithium-ion battery 40 is promoted as shown by arrows R3 schematically indicating the flow of current in FIG. 6.

In step S530, the lithium-ion battery state monitoring unit 32 resets the second lead battery charge request flag F12 to "0" or maintains the second lead battery charge request flag F12 at "0".

In step S532, the lithium-ion battery state monitoring unit 32 sets the depolarization flag F1 to "1".

In step S534, the lithium-ion battery state monitoring unit 32 activates a timer Tm that times out upon the lapse of the depolarization discharge time Ta.

In step S536, the lithium-ion battery state monitoring unit 32 turns off the switch SW2. Thus, the lithium-ion battery 40 is electrically disconnected from the lead battery 4, the alternator 6, the auxiliary machinery 5, the second auxiliary machinery 50, and the third auxiliary machinery 54 (i.e., the electric power supply circuit of the dual electric power supply system 1). When the lithium-ion battery 40 is electrically disconnected from the electric power supply circuit of the dual electric power supply system 1, the lithium-ion battery 40 is gradually depolarized afterward with the lapse of time. When step S536 is ended, the lithium-ion battery state monitoring unit 32 ends the process in the present cycle. When the lithium-ion battery 40 is electrically disconnected from the electric power supply circuit of the dual electric power supply system 1, electric power is supplied to the auxiliary machinery 5, the second auxiliary machinery 50, and the third auxiliary machinery 54 by the alternator 6 and the lead battery 4, as shown by arrows R11 and R12 schematically indicating the flow of current in FIG. 7.

In step S538, the lithium-ion battery state monitoring unit 32 determines whether the timer Tm has timed out. If the result of the determination is "YES", the lithium-ion battery state monitoring unit 32 proceeds to step S540. Otherwise, the lithium-ion battery state monitoring unit 32 ends the process in the present cycle.

In step S540, the lithium-ion battery state monitoring unit 32 acquires an open-circuit voltage of the lithium-ion battery 40 based on an output value of the voltage sensor 84.

In step S542, the lithium-ion battery state monitoring unit 32 initializes the SOC of the lithium-ion battery 40 by calculating the SOC of the lithium-ion battery 40 based on the open-circuit voltage acquired in step S540. As in step S506, the SOC of the lithium-ion battery 40 can be calculated from the open-circuit voltage through the use of a characteristic map or relational expression representing a relationship between the open-circuit voltage and the SOC. As described above, the SOC of the lithium-ion battery and the open-circuit voltage of the depolarized lithium-ion battery are closely correlated with each other. When the switch SW2 is off, the lithium-ion battery 40 is substantially not charged or discharged. Thus, the lithium-ion battery 40 is highly likely to have been depolarized upon the lapse of the depolarization discharge time Ta in a state where the switch SW2 is off. Accordingly, by using the open-circuit voltage obtained upon the lapse of the depolarization discharge time Ta in the state where the switch SW2 is off, it is possible to accurately calculate the SOC of the lithium-ion battery 40.

In step S544, the lithium-ion battery state monitoring unit 32 initializes the integrated current value $I_{total}$ of the lithium-ion battery 40 to "0" as the SOC of the lithium-ion battery 40 is initialized in step S542.

In step S546, the lithium-ion battery state monitoring unit 32 turns on the switch SW2. Thus, the lithium-ion battery 40 is stopped from being electrically disconnected from the lead battery 4, the alternator 6, the auxiliary machinery 5, the second auxiliary machinery 50, and the third auxiliary machinery 54 (i.e., the electric power supply circuit of the dual electric power supply system 1).

In step S548, the lithium-ion battery state monitoring unit 32 resets the depolarization flag F1 to "0".

According to the process shown in FIG. 5, when the integrated current value $I_{total}$ becomes equal to or larger than the prescribed threshold, the open-circuit voltage acquisition process and the SOC calculation process can be executed. Therefore, at timing at which the possibility of deterioration in calculation accuracy becomes high, the SOC of the lithium-ion battery 40 can be updated (corrected) again to an accurate value based on the open-circuit voltage.

According to the process shown in FIG. 5, in a case where the SOC of the lead battery 4 is not equal to or higher than the depolarization enabling SOC when the integrated current value $I_{total}$ becomes equal to or larger than the prescribed threshold, the second lead battery charge request flag F12 is set to "1". When the second lead battery charge request flag F12 is set to "1", this flag is held at "1" until the SOC of the lead battery 4 becomes equal to or higher than the depolarization enabling SOC (see steps S526 and S528). Thus, according to the process shown in FIG. 5, in the case where the SOC of the lead battery 4 is not equal to or higher than the depolarization enabling SOC when the integrated current value $I_{total}$ becomes equal to or larger than the prescribed threshold, the lead battery SOC increasing control is performed by the generator control unit 34 and the voltage converter control unit 36 such that the SOC of the lead battery 4 becomes equal to or higher than the depolarization enabling SOC. Thus, it is possible to reduce the possibility that the SOC of the lead battery 4 falls below (i.e., becomes lower than) the prescribed regular lower-limit SOC during the open-circuit voltage acquisition process and the SOC calculation process.

In the process shown in FIG. 5, in the case where the SOC of the lead battery 4 is not equal to or higher than the depolarization enabling SOC when the integrated current value $I_{total}$ becomes equal to or larger than the prescribed threshold, the second lead battery charge request flag F12 is set to "1", but the disclosure is not limited thereto. In a modification example, a stand-by state may be maintained until the SOC of the lead battery 4 becomes equal to or higher than the depolarization enabling SOC, instead of setting the second lead battery charge request flag F12 to "1". It should be noted, however, that the process shown in FIG. 5 makes it possible to more quickly start the open-circuit voltage acquisition process and the SOC calculation process than in this modification example, in the case where the open-circuit voltage acquisition process and the SOC calculation process cannot be immediately executed when the integrated current value $I_{total}$ becomes equal to or larger than the prescribed threshold.

In FIG. 5, due to step S530, the lead battery SOC increasing control is not performed by the generator control unit 34 and the voltage converter control unit 36 until the timer Tm times out after being activated, but the disclosure is not limited thereto. The lead battery SOC increasing control may be appropriately performed by the generator control unit 34 and the voltage converter control unit 36 before the timer Tm times out after being activated.

Next, an example of a manner in which the SOC of the lead battery 4 changes and an example of a manner in which the SOC of the lithium-ion battery 40 changes will be described with reference to FIGS. 8A to 9.

Figure 8A:
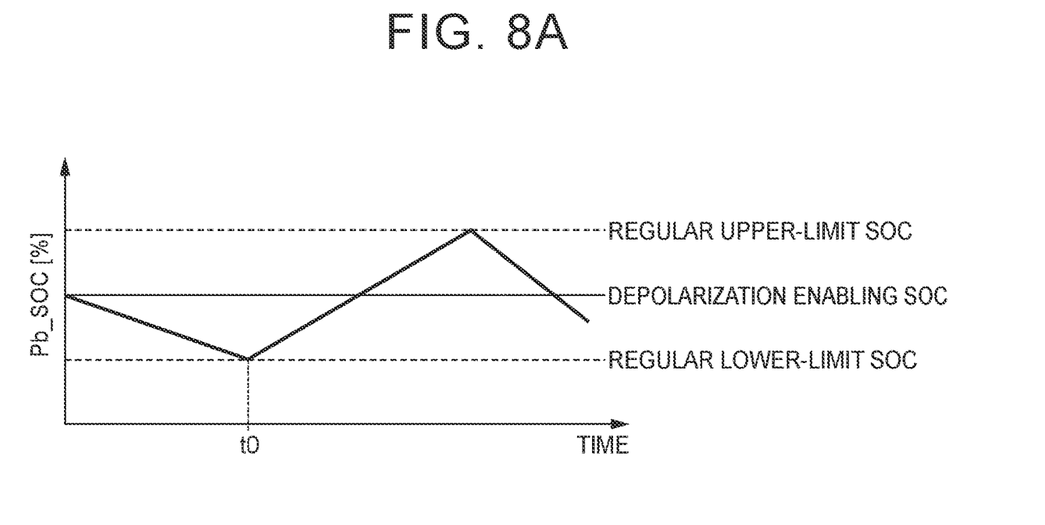
FIG. 8A is a view illustrating a manner in which the SOC of a lead battery changes in a situation where an integrated current value is smaller than a prescribed threshold.
Figure 8B:
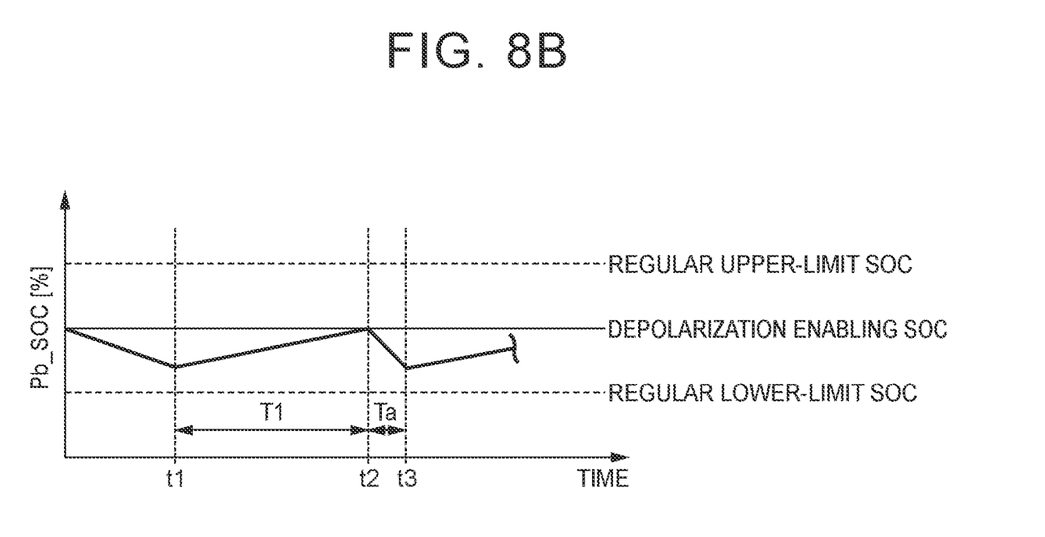
FIG. 8B is a view illustrating a manner in which the SOC of the lead battery changes after the integrated current value becomes equal to or larger than the prescribed threshold.

Each of FIGS. 8A and 8B is a view showing an example of a manner in which the SOC of the lead battery 4 changes. FIG. 8A is a view illustrating the manner in which the SOC of the lead battery 4 changes in a situation where the integrated current value $I_{total}$ is smaller than the prescribed threshold. FIG. 8B is a view illustrating the manner in which the SOC of the lead battery 4 changes after the integrated current value $I_{total}$ becomes equal to or larger than the prescribed threshold.

In FIG. 8A, at a time point t0, the SOC of the lead battery 4 becomes equal to or lower than the prescribed regular lower-limit SOC, and the first lead battery charge request flag F11 becomes equal to "1". Accordingly, the SOC of the lead battery 4 increases. In FIG. 8A, both the above-described depolarization enabling SOC and the regular upper-limit SOC are shown. The depolarization enabling SOC is set to be equal to or lower than the regular upper-limit SOC, and is an intermediate value between the regular upper-limit SOC and the regular lower-limit SOC in FIG. 6. Thus, in a situation where the integrated current value $I_{total}$ is smaller than the prescribed threshold, the SOC of the lead battery 4 is prevented from significantly falling below (becoming significantly lower than) the prescribed regular lower-limit SOC, by the lead battery state monitoring unit 38.

In FIG. 8B, the integrated current value $I_{total}$ becomes equal to or larger than the prescribed threshold at a time point t1. At the time point t1, the SOC of the lead battery 4 is not equal to or higher than the depolarization enabling SOC, and thus, the second lead battery charge request flag F12 is set to "1". Accordingly, the SOC of the lead battery 4 increases. At a time point t2 after the lapse of a time T1 from the time point t1, the SOC of the lead battery 4 becomes equal to or higher than the depolarization enabling SOC, and the second lead battery charge request flag F12 is set to "0". At the time point t2, the open-circuit voltage acquisition process is started, and the switch SW2 is turned off. Accordingly, the SOC of the lead battery 4 decreases (see FIG. 7). After the time point t2, the depolarization discharge time Ta elapses before the SOC of the lead battery 4 falls below the regular lower-limit SOC. The switch SW2 is turned on at a time point t3 after the lapse of the depolarization discharge time Ta from the time point t2. Accordingly, in FIG. 8B, the SOC of the lead battery 4 is stopped from falling from the time point t3.

Figure 9:
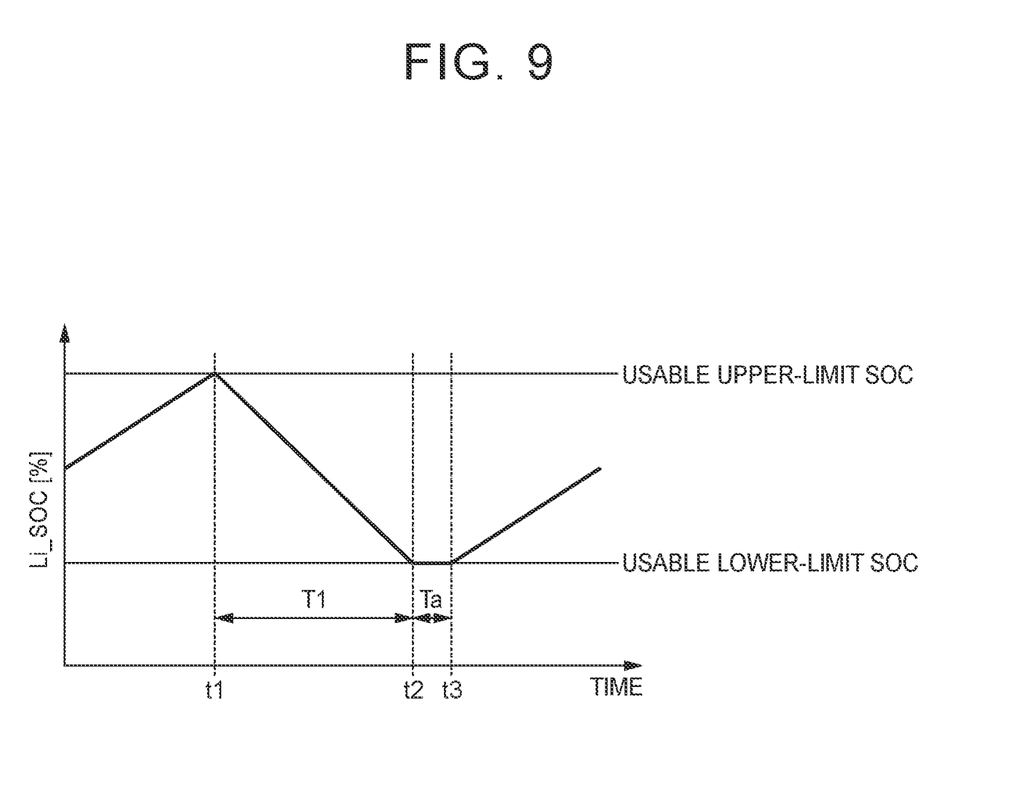
FIG. 9 is a view illustrating an example of a manner in which the SOC of a lithium-ion battery changes.

FIG. 9 is a view showing an example of a manner in which the SOC of the lithium-ion battery 40 changes. FIG. 9 is a view illustrating the manner in which the SOC of the lithium-ion battery 40 changes after the integrated current value $I_{total}$ becomes equal to or larger than the prescribed threshold, in the same situation as in FIG. 8B.

In FIG. 9 as well as FIG. 8B, the integrated current value $I_{total}$ becomes equal to or larger than the prescribed threshold at the time point t1, and the SOC of the lead battery 4 is not equal to or higher than the depolarization enabling SOC at the time point t1, and thus, the second lead battery charge request flag F12 is set to "1". Accordingly, the lead battery 4 is charged with the current from the lithium-ion battery 40, and the SOC of the lithium-ion battery 40 decreases. At the time point t2 after the lapse of the time T1 from the time point t1, the SOC of the lead battery 4 becomes equal to or higher than the depolarization enabling SOC, and the second lead battery charge request flag F12 is set to "0". At the time point t2, the open-circuit voltage acquisition process is started, and the switch SW2 is turned off. Accordingly, the SOC of the lithium-ion battery 40 is maintained. In FIG. 9, the SOC of the lithium-ion battery 40 is held at a usable lower-limit SOC after having fallen thereto. At the time point t3 after the lapse of the depolarization discharge time Ta from the time point t2, the switch SW2 is turned on as a result of the completion of the open-circuit voltage acquisition process and the SOC calculation process. Accordingly, in FIG. 9, from the time point t3, the lithium-ion battery 40 is charged, and the SOC of the lithium-ion battery 40 increases.

Although the embodiment of the disclosure has been described above in detail, the disclosure is not limited to the embodiment. Various changes and modifications may be made to the embodiment without departing from the scope of the disclosure. Further, it is also possible to combine all or some of the components of the foregoing embodiment of the disclosure with one another.

What is claimed is:

1. An electric power supply system comprising:
   a first battery provided in an electric power supply circuit;
   a second battery provided in the electric power supply circuit and electrically connected in parallel to the first battery, the second battery being a lithium-ion battery;
   an electric load provided in the electric power supply circuit and electrically connected in parallel to the first battery and the second battery;
   a switch provided in the electric power supply circuit, the switch being configured to electrically disconnect the second battery from the electric power supply circuit when the switch is open; and
   a control device configured to:
      open the switch when an ignition switch is on and a state of charge of the first battery is equal to or greater than a prescribed state of charge; and
      in response to an integrated current value becoming equal to or greater than a prescribed value, where the integrated current value is an integrated value of a charge current of the second battery and a discharge current of the second battery:
         execute an open-circuit voltage acquisition process that acquires an open-circuit voltage of the second battery after a lapse of a prescribed period of time from a time when the switch is opened, and
         execute a state-of-charge calculation process that calculates a state of charge of the second battery based on the open-circuit voltage acquired through the open-circuit voltage acquisition process.

2. The electric power supply system according to claim 1, wherein the control device is configured to further execute a charge process that charges the first battery such that the state of charge of the first battery becomes equal to or greater than the prescribed state of charge, in a case where the state of charge of the first battery is not equal to or greater than the prescribed state of charge when the integrated current value becomes equal to or larger than the prescribed value.

3. The electric power supply system according to claim 2, further comprising an alternator provided in the electric power supply circuit, the alternator being electrically connected in parallel to the first battery, the second battery, and the electric load, wherein the charge process includes charging the first battery using the second battery and the alternator.

4. The electric power supply system according to claim 1, wherein the control device is configured to charge the first battery using the second battery, before executing the open-circuit voltage acquisition process.

5. The electric power supply system according to claim 1, wherein the first battery is a lead battery.

6. A method of controlling an electric power supply system comprising:

provide (i) a first battery provided in an electric power supply circuit, (ii) a second battery provided in the electric power supply circuit and electrically connected in parallel to the first battery, the second battery being a lithium-ion battery, (iii) an electric load provided in the electric power supply circuit and electrically connected in parallel to the first battery and the second battery, and (iv) a switch provided in the electric power supply circuit and configured to electrically disconnect the second battery from the electric power supply circuit when the switch is open;

opening, by a control device, the switch when an ignition switch is on and a state of charge of the first battery is equal to or greater than a prescribed state of charge; and in response to an integrated current value becoming equal to or greater than a prescribed value, where the integrated current value is an integrated value of a charge current of the second battery and a discharge current of the second battery:

executing, by the control device, an open-circuit voltage acquisition process that acquires an open-circuit voltage of the second battery after a lapse of a prescribed period of time from a time when the switch is opened, and executing, by the control device, a state-of-charge calculation process that calculates a state of charge of the second battery based on the open-circuit voltage acquired through the open-circuit voltage acquisition process.

* * * * *